(12) United States Patent
Usuda

(10) Patent No.: US 10,454,458 B2
(45) Date of Patent: Oct. 22, 2019

(54) LATCH CIRCUIT AND COMPARATOR CIRCUIT

(71) Applicant: TOSHIBA MEMORY CORPORATION, Minato-ku, Tokyo (JP)

(72) Inventor: Masayuki Usuda, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/695,938

(22) Filed: Sep. 5, 2017

(65) Prior Publication Data

US 2018/0262182 A1 Sep. 13, 2018

(30) Foreign Application Priority Data

Mar. 13, 2017 (JP) ................................. 2017-047689

(51) Int. Cl.
*H03K 3/2885* (2006.01)
*H03K 3/012* (2006.01)
*H03K 3/037* (2006.01)
*H03K 3/356* (2006.01)

(52) U.S. Cl.
CPC .......... *H03K 3/2885* (2013.01); *H03K 3/012* (2013.01); *H03K 3/0375* (2013.01); *H03K 3/356034* (2013.01); *H03K 3/356052* (2013.01)

(58) Field of Classification Search
CPC ..... H03K 3/2885; H03K 3/012; H03K 3/0375
See application file for complete search history.

(56) References Cited

U.S. PATENT DOCUMENTS 4,439,822 A * 3/1984 Cocconi .............. H02M 3/3378
363/24
7,479,806 B2 1/2009 Teh et al.

FOREIGN PATENT DOCUMENTS

| JP | 2004-214717 A | 7/2004 |
| JP | 3579820 B2 | 10/2004 |
| JP | 2009-005029 A | 1/2009 |

* cited by examiner

*Primary Examiner* — Daniel C Puentes
(74) *Attorney, Agent, or Firm* — Foley & Lardner LLP

(57) ABSTRACT

A latch circuit includes first and second NAND circuits and first and second capacitive elements. The first NAND circuit has a first input node into which a first signal is input. The second NAND circuit has a first input node into which a second signal is input, a second input node which is connected to an output node of the first NAND circuit, and an output node which is connected to a second input node of the first NAND circuit. The first capacitive element has one end connected to the first input node of the first NAND circuit and has another end connected to the output node of the first NAND circuit. The second capacitive element has one end connected to the first input node of the second NAND circuit and has another end connected to the output node of the second NAND circuit.

4 Claims, 13 Drawing Sheets

LATCH CIRCUIT AND COMPARATOR CIRCUIT

CROSS-REFERENCE TO RELATED APPLICATION

This application claims the benefit of and priority to Japanese Patent Application No. 2017-047689, filed Mar. 13, 2017, the entire contents of which are incorporated herein by reference.

FIELD

Embodiments described herein relate generally to a semiconductor circuit using an SR (set-reset) latch.

BACKGROUND

A comparator circuit can use an SR (set-reset) latch circuit.

DETAILED DESCRIPTION

Figure 1:
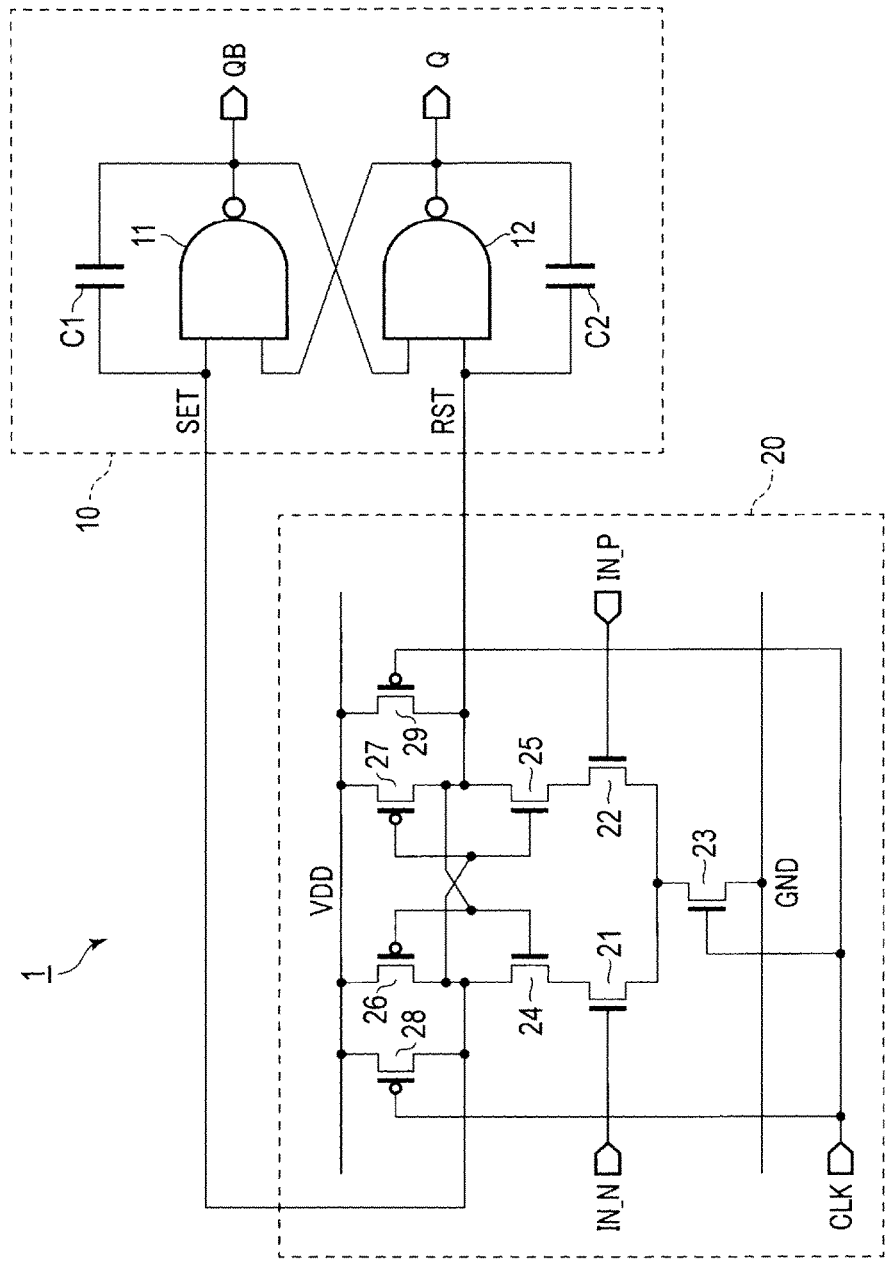
FIG. 1 is a circuit diagram of a comparator circuit according to some embodiments.

An example embodiment provides a latch circuit and a comparator circuit capable of extending an operation area.

In general, according to some embodiments, the latch circuit may include first and second NAND circuits and first and second capacitive elements. In some embodiments, in the first NAND circuit, a first signal may be input into a first input node. In some embodiments, in the second NAND circuit, a second signal may be input into the first input node, a second input node may be connected to an output node of the first NAND circuit, and the output node may be connected to the second input node of the first NAND circuit. In some embodiments, in the first capacitive element, one end may be connected to the first input node of the first NAND circuit and the other end may be connected to the output node of the first NAND circuit. In some embodiments, in the second capacitive element, one end may be connected to the first input node of the second NAND circuit and the other end may be connected to the output node of the second NAND circuit.

Hereinafter, embodiments will be described with reference to the accompanying drawings. The drawings are schematic. Further, in the following description, the same reference numerals may refer to components having substantially the same function and configuration.

Hereinafter, a comparator circuit according to some embodiments will be described.

First, the configuration of the first comparator circuit 1 is described with reference to FIG. 1. FIG. 1 illustrates the circuit configuration of the comparator circuit 1. As illustrated in FIG. 1, the comparator circuit 1 includes a latch circuit 10 and an amplifier circuit 20.

In some embodiments, the latch circuit 10 is, for example, an SR latch circuit into which a set signal SET and a reset signal RST are input. In some embodiments, as illustrated in FIG. 1, the latch circuit 10 includes NAND (negative-AND) circuits 11 and 12 and capacitive elements C1 and C2.

In some embodiments, the set signal SET is input into a first input node of the NAND circuit 11, and the reset signal RST is input into a first input node of the NAND circuit 12. In some embodiments, the output node of the NAND circuit 11 is connected to a second input node of the NAND circuit 12. In some embodiments, the output node of the NAND circuit 12 is connected to a second input node of the NAND circuit 11. In some embodiments, an output signal QB is output from the output node of the NAND circuit 11, and an output signal Q is output from the output node of the NAND circuit 12.

In some embodiments, one end of the capacitive element C1 is connected to the first input node of the NAND circuit 11. In some embodiments, the other end of the capacitive element C1 is connected to the output node of the NAND circuit 11. In some embodiments, one end of the capacitive element C2 is connected to the first input node of the NAND circuit 12. In some embodiments, the other end of the capacitive element C2 is connected to the output node of the NAND circuit 12. In some embodiments, capacitance of the capacitive element C1 may be substantially the same as, for example, parasitic capacitance of the NAND circuit 11. In some embodiments, the capacitance of the capacitive element C2 may be substantially the same as, for example, parasitic capacitance of the NAND circuit 12. Other embodiments are not limited to the capacitances of the capacitive elements C1 and C2 and may include any capacitances.

In some embodiments, the amplifier circuit 20 may be, for example, a differential amplifier circuit that amplifies a difference of input signals IN_N and IN_P. In some embodiments, as illustrated in FIG. 1, the amplifier circuit 20 includes N channel MOS transistors 21 to 25 and P channel MOS transistors 26 to 29.

Referring to FIG. 1, in some embodiments, the input signal IN_N is input into the gate of the transistor 21. In some embodiments, the input signal IN_P is input into the gate of the transistor 22. In some embodiments, one end of each of the transistors 21 and 22 is connected to one end of the transistor 23. In some embodiments, the other end of the transistor 23 is connected to a ground line GND. In some embodiments, the other ends of the transistors 21 and 22 are connected to one end of the transistor 24 and one end of the transistor 25, respectively. In some embodiments, the gates of the transistors 24 and 25 are connected to the other ends of the transistors 25 and 24, respectively.

Referring to FIG. 1, in some embodiments, one end of the transistor 26 and one end of the transistor 27 are connected to the other ends of the transistors 24 and 25, respectively. In some embodiments, the other ends of the transistors 26 and 27 are connected to a power supply line VDD. In some embodiments, the gates of the transistors 26 and 27 are connected to the gates of the transistors 24 and 25, respectively. In some embodiments, one end of the transistor 28 and one end of the transistor 29 are connected to the other ends of the transistors 24 and 25, respectively. In some embodiments, the other ends of the transistors 28 and 29 are connected to the power supply line VDD.

Referring to FIG. 1, in some embodiments, in the amplifier circuit 20 described above, a clock signal CLK is input into the gates of the transistors 23, 28, and 29. In some embodiments, one end of the transistor 28 and one end of the transistor 29 are used as outputs of the differential amplifier circuit. That is, in the comparator circuit 1 according to some embodiments, one end of the transistor 28 is connected to the first input node of the NAND circuit 11, and one end of the transistor 29 is connected to the first input node of the NAND circuit 12.

Other embodiments are not limited to the circuit configuration of the comparator circuit 1 described above. In some embodiments, the amplifier circuit 20 may be the differential amplifier circuit capable of amplifying a difference of two input signals and may not have the circuit configuration illustrated in FIG. 1.

Operation of Comparator Circuit 1

Figure 2:
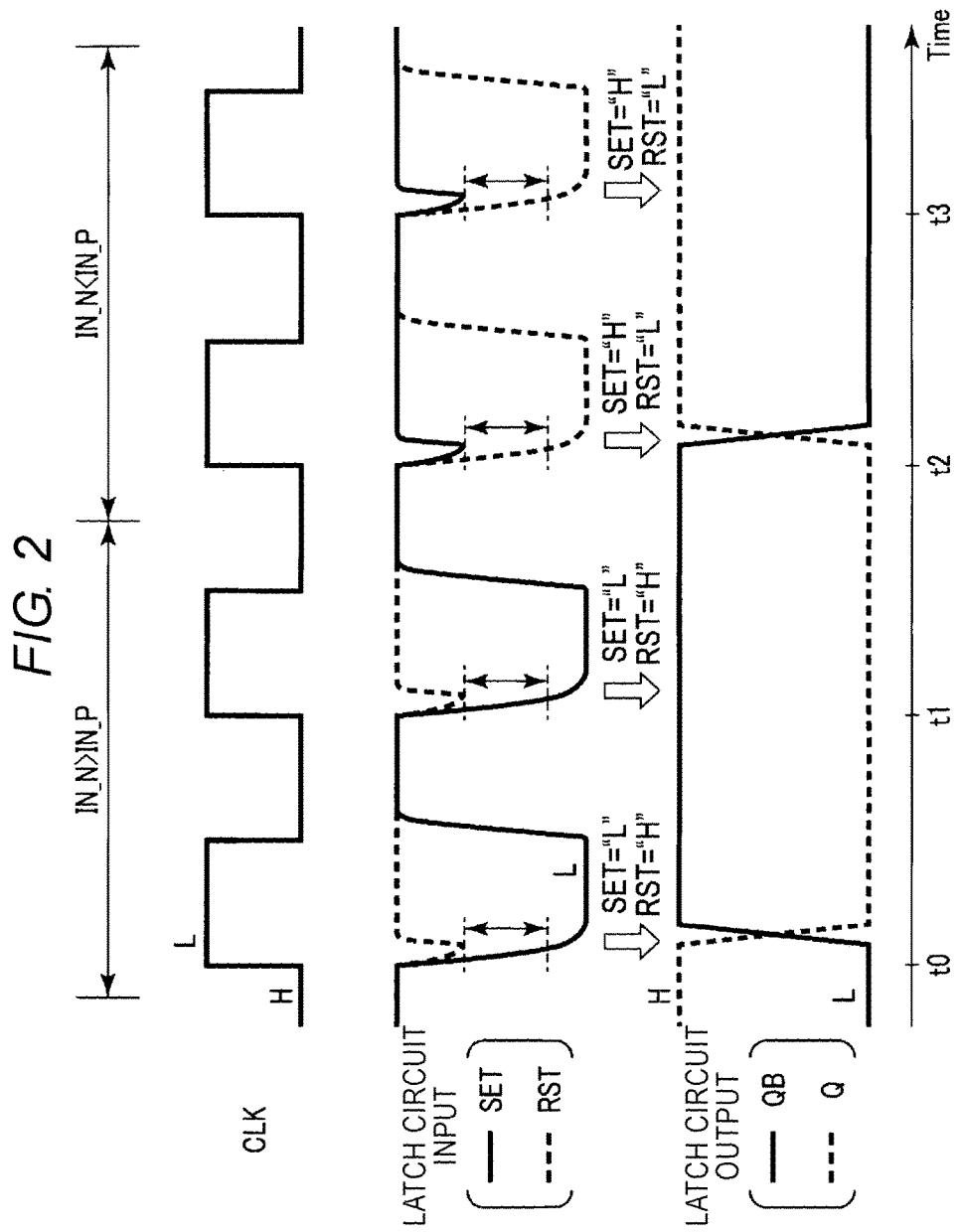
FIG. 2 is an operation timing chart of the comparator circuit according to some embodiments.

Subsequently, the operation of the comparator circuit 1 will be described with reference to FIG. 2. FIG. 2 illustrates an operation timing chart of the comparator circuit 1 and illustrates examples of waveforms of the clock signal CLK, and the input signal and the output signal of the latch circuit 10. Further, in FIG. 2, the set signal SET and the reset signal RST corresponding to the input signal of the latch circuit 10 are expressed by a solid line and a dotted line, respectively. The output signals QB and Q corresponding to the output signal of the latch circuit 10 are expressed by the solid line and the dotted line, respectively. Further, in the following description, level "H" represents a voltage value corresponding to a first logic state, and level "L" represents the voltage value corresponding to a second logic state different from the first logic state.

In some embodiments, as illustrated in FIG. 2, the voltage values of the input signals IN_N and IN_P are such that IN_N<IN_P during a period in which the clock signal CLK is at level "H" from time t0 and t1 and IN_N>IN_P during a period in which the clock signal CLK is at level "H" from time t2 and t3. In some embodiments, as illustrated in FIG. 2, in an initial state before the time t0, the set signal SET and the reset signal RST are at level "H," and the output signals QB and Q are at levels "L" and "H," respectively.

In some embodiments, when the clock signal CLK changes to level "H" from level "L" at the time t0, voltages of the set signal SET and the reset signal RST drop based on the voltage values of the input signals IN_N and IN_P. During this period, in some embodiments, IN_N<IN_P, and since the voltage of the reset signal RST drops faster than the voltage of the set signal SET, the voltage of the reset signal RST first drops to the voltage at level "L." As a result, in some embodiments, in the NAND circuit 12, since a signal at level "L" is input into the first and second input nodes, the output signal QB changes to level "H" from level "L." In some embodiments, when the output signal QB is at level "H," in the NAND circuit 11, since the signal at level "H" is input into the first and second input nodes, the output signal Q changes to level "L" from level "H." In some embodiments, when the clock signal CLK changes to level "L" from level "H," since nodes corresponding to the set signal SET and the reset signal RST are charged, the voltages of the set signal SET and the reset signal RST return to the initial state. Further, in the following description, the description of the operation in which the voltages of the set signal SET and the reset signal RST return to the initial state based on the clock signal CLK may be omitted.

In some embodiments, when the clock signal CLK changes to level "H" from level "L" at the time t1, the voltages of the set signal SET and the reset signal RST drop and the voltage of the reset signal RST first drops to the voltage of level "L" similarly to the time t0. As a result, in some embodiments, in the NAND circuit 12, since the signal at level "L" is input into the first and second input nodes, the output signal Q is maintained at level "H." In some embodiments, in the NAND circuit 11, since the signal at level "H" is maintained to be input into the first and second input nodes, the output signal QB is maintained at level "L."

In some embodiments, when the clock signal CLK changes to level "H" from level "L" at the time t2, this period shows IN_N>IN_P and the voltages of the set signal SET drops faster than the voltage of the reset signal RST. As a result, in some embodiments, the voltage of the set signal SET first drops to the voltage of level "L." As a result, in some embodiments, in the NAND circuit 11, since the signal at level "L" is input into the first and second input nodes, the output signal Q changes to level "H" from level "L." In some embodiments, when the output signal Q is at level "H," in the NAND circuit 12, since the signal at level "H" is input into the first and second input nodes, the output signal QB changes to level "L" from level "H."

In some embodiments, when the clock signal CLK changes level "H" from level "L" at the time t3, the voltages of the set signal SET and the reset signal RST drop and the voltage of the set signal SET first drops to the voltage of level "L" similarly to the time t2. As a result, in some embodiments, in the NAND circuit 11, since the signal at level "L" is input into the first and second input nodes, the output signal Q is maintained at level "H." In some embodiments, in the NAND circuit 12, since the signal at level "H" is maintained to be input into the first and second input nodes, the output signal QB is maintained at level "L."

Figure 6:
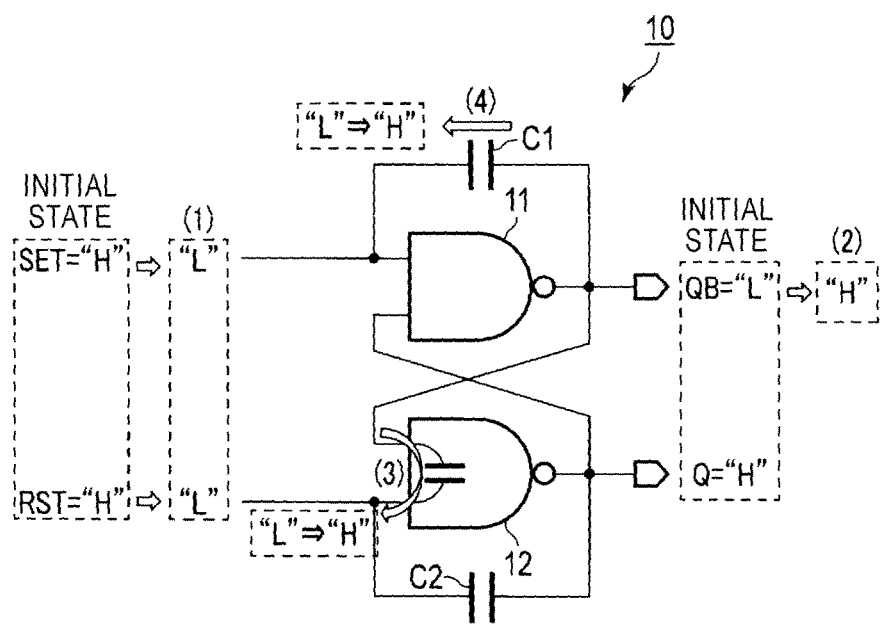
FIG. 6 is a diagram for describing the operation of the latch circuit in the comparator circuit according to some embodiments.

Effect of the Embodiments Illustrated in FIG. 1, FIG. 2, or FIG. 6

According to the comparator circuit 1 regarding some embodiments, the operation area of the comparator circuit 1 may be extended. Hereinafter, this effect will be described in detail.

In some embodiments, when a potential difference of two input signals is small in the comparator circuit, a correct determination result may not be obtained. In some embodiments, as one of these factors, for example, the influence of the parasitic capacitance of the SR latch circuit used in the comparator circuit may be considered. Hereinafter, the operation in such a case will be described by using the comparator circuit according to a comparative example illustrated in FIG. 3.

Figure 3:
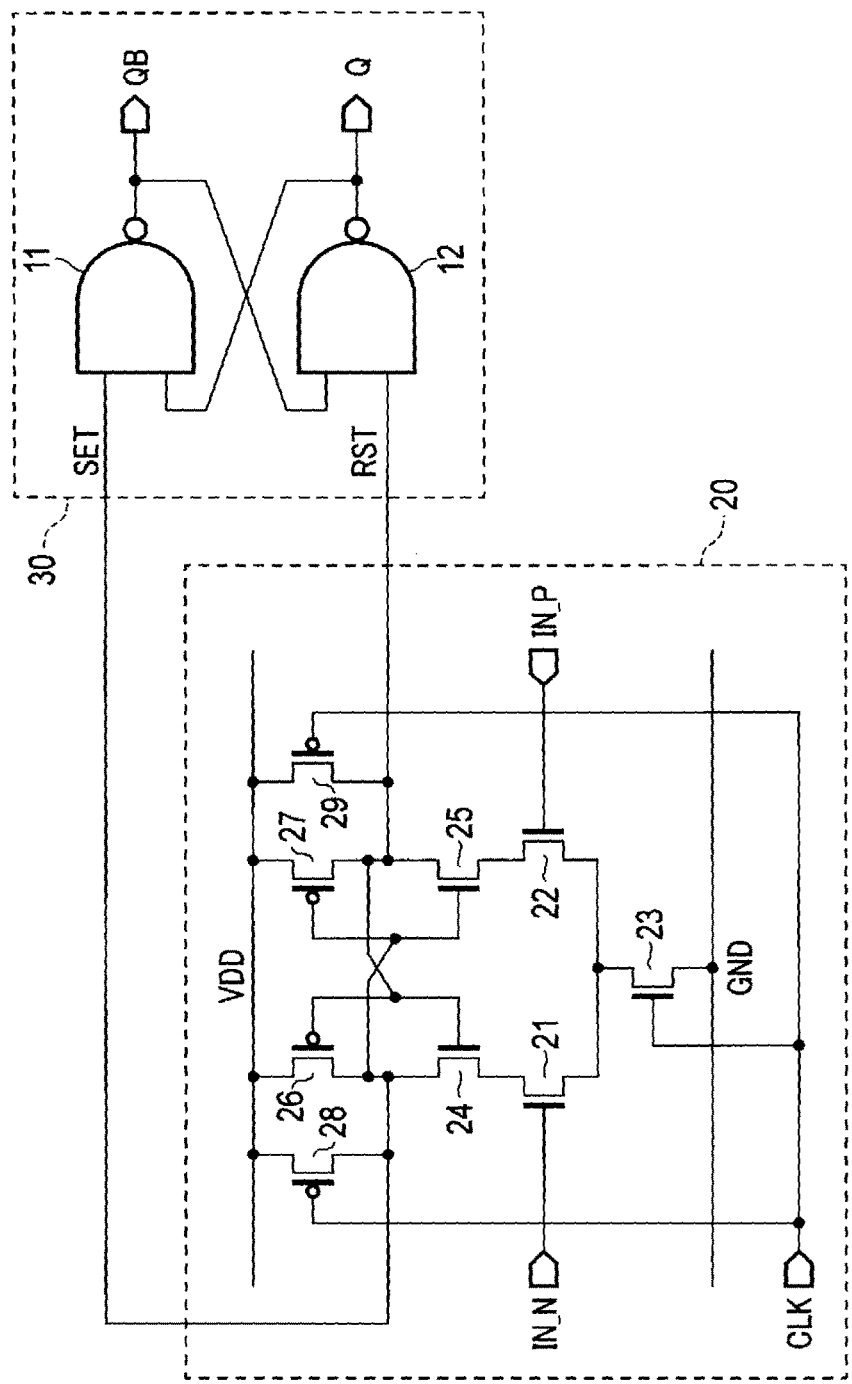
FIG. 3 is a circuit diagram of a comparator circuit according to a comparative example.
Figure 4:
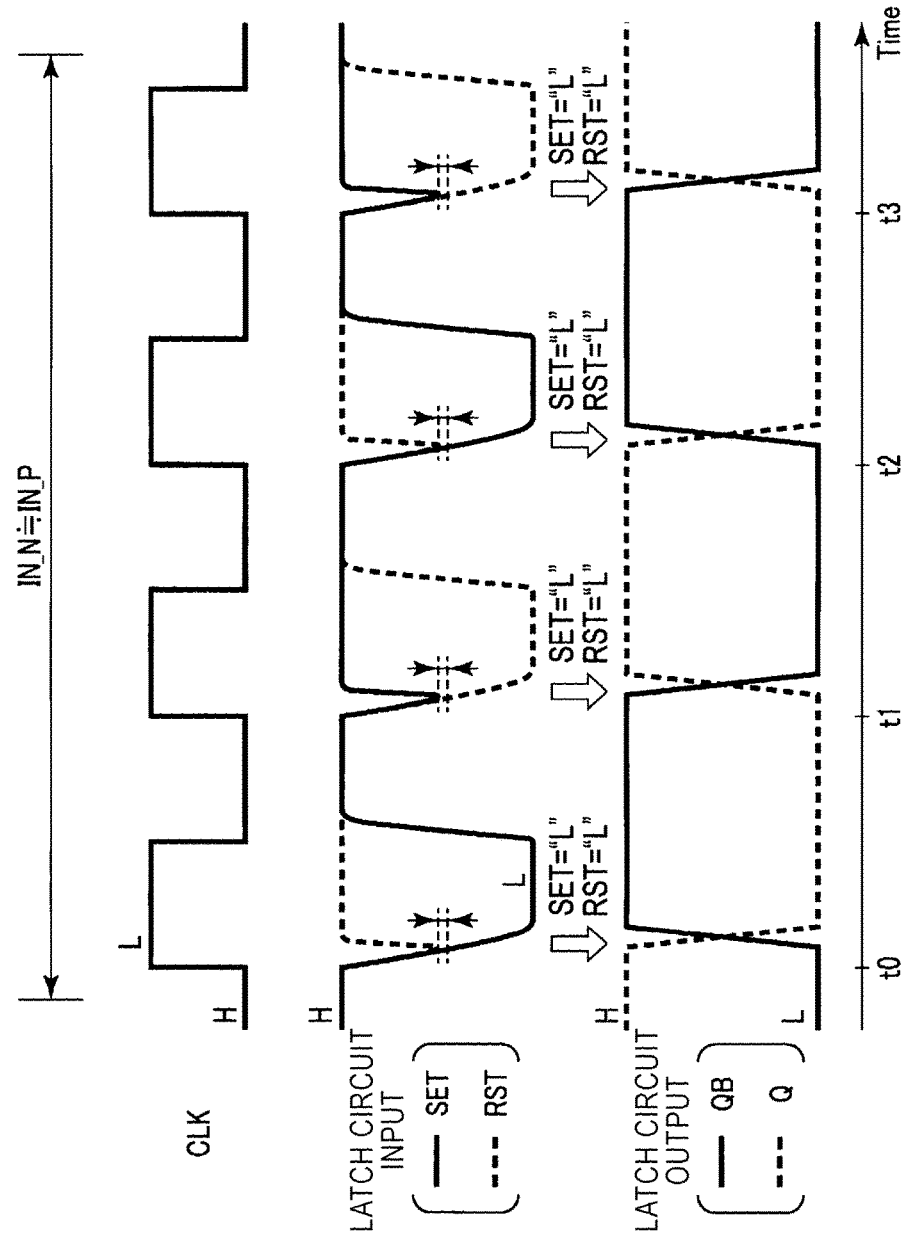
FIG. 4 is the operation timing chart of the comparator circuit according to some embodiments.
Figure 5:
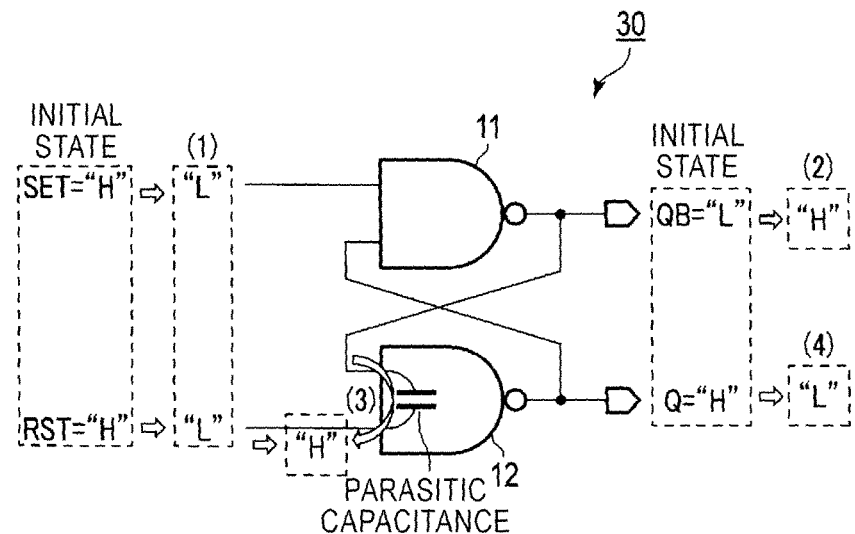
FIG. 5 is a diagram for describing an operation of a latch circuit in the comparator circuit according to a comparative example.

The circuit configuration of the comparator circuit according to the comparative example is illustrated in FIG. 3, in which the latch circuit 10 in FIG. 1 is substituted with a latch circuit 30 which does not include the capacitive elements C1 and C2 illustrated in FIG. 1. The comparator circuit according to the comparative example operates, for example, as illustrated in FIG. 4 and FIG. 5 when the potential difference of the input signals IN_N and IN_P is small. FIG. 4 is the same operation timing chart as FIG. 2, and FIG. 5 illustrates the operation of the latch circuit 30 at the time t0 of FIG. 4.

As illustrated in FIG. 4, the voltage values of the input signals IN_N and IN_P in this example show IN_N≈IN_P during a whole period illustrated in FIG. 4. Further, in the initial state before the time t0, the set signal SET and the reset signal RST are at level "H" and the output signals QB and Q are at levels "L" and "H," respectively.

When the clock signal CLK changes to level "H" from level "L" at the time t0, the potential difference of the output signals IN_N and IN_P is small, and as a result, the voltage of the set signal SET and the voltage of the reset signal RST drop at the same speed. Therefore, before the potential difference of the set signal SET and the reset signal RST increases, both the voltages of the set signal SET and the reset signal RST drop up to the voltage at level "L" ((1) of FIG. 5). As a result, in the NAND circuit 11 as shown in FIG. 3, since the signals at levels "L" and "H" are input into the first and second input nodes, respectively, the output signal QB changes to level "H" from level "L" ((2) of FIG. 5). In this case, a change in output voltage of the NAND circuit 11 as shown in FIG. 3 is transferred through the parasitic capacitance between the first and second input nodes of the NAND circuit 12 as shown in FIG. 3 and the voltage of the first input node of the NAND circuit 12 is at level "H" from level "L" ((3) of FIG. 5). Therefore, in the NAND circuit 12 as shown in FIG. 3, the signal at level "H" is input into the first and second input nodes, and as a result, the output signal Q is at level "L" from level "H" ((4) of FIG. 5). Further, the operations at the time t1 and the time t3 are the same as those in which the operations corresponding to the NAND circuits 11 and 12 in the operation at the time t0 are reversed, and the operation at the time t2 is the same as the operation at the time t0, and as a result, the description will be omitted.

As described above, in the comparator circuit, when the potential difference of the input signals IN_N and IN_P is small, the output signals QB and B may be changed by the influence of the initial state of the SR latch circuit and the parasitic capacitances of the NAND circuits 11 and 12. In this case, logic states of the output signals QB and Q may be replaced for every cycle of the clock signal CLK. In the comparator circuit, since it is difficult to obtain the correct determination result in an area in which the output signal is oscillated, the oscillation area can be suppressed in order to improve determination precision.

Therefore, in the comparator circuit 1 according to some embodiments, the latch circuit 10 includes the capacitive elements C1 and C2 (see FIG. 1). In some embodiments, the capacitive element C1 corresponding to the parasitic capacitance of the NAND circuit 11 is connected between the first input node and the output node of the NAND circuit 11 (see FIG. 1), and the capacitive element C2 corresponding to the parasitic capacitance of the NAND circuit 12 is connected between the first input node and the output node of the NAND circuit 12 (see FIG. 1). Hereinafter, the operation of the comparator circuit 1 according to some embodiments when the potential difference of the input signals IN_N and IN_P is small will be described with reference to FIG. 6. FIG. 6 illustrates the operation of the latch circuit 10 in the same situation as the latch circuit 30 illustrated in FIG. 5 (as a comparative example).

In some embodiments, when the clock signal CLK changes to level "H" from level "L" from the initial state, the potential difference of the output signals IN_N and IN_P may be small, and as a result, the voltage of the set signal SET and the voltage of the reset signal RST may drop at the same speed. Then, before the potential difference of the set signal SET and the reset signal RST increases, both the voltage of the set signal SET and the voltage of the reset signal RST may drop up to the voltage at level "L" ((1) of FIG. 6). As a result, in the NAND circuit 11 (as shown in FIG. 6), since the signals at levels "L" and "H" are input into the first and second input nodes, respectively, the output signal QB may change to level "H" from level "L" ((2) of FIG. 6). In this case, in some embodiments, the change in output voltage of the NAND circuit 11 may be transferred through the parasitic capacitance between the first and second input nodes of the NAND circuit 12, and the voltage of the first input node of the NAND circuit 12 may rise ((3) of FIG. 6). As a result, in some embodiments, the output voltage of the NAND circuit 12 (as shown in FIG. 6) may drop, and the voltage change may be transferred to the first input node of the NAND circuit 12 through the capacitive element C2 ((4) of FIG. 6). That is, in some embodiments, the voltage of the first input node of the NAND circuit 12 may tend to rise to level "H" from level "L" in (3) of FIG. 6 and may tend to drop to level "L" from level "H" in (4) of FIG. 6.

As such, in some embodiments, since the operation corresponding to (3) of FIG. 6 and the operation corresponding to (4) of FIG. 6 become operations (canceling operations) which cancel both operations each other, the change in voltage in the first input node and the output node of the NAND circuit 12 may be suppressed. In some embodiments, since the voltage change in the first input node of the NAND circuit 12 is suppressed, the voltage change in the second input node of the NAND circuit 12 may be also suppressed, and as a result, the change of the output signal QB described in (2) of FIG. 6 may be also suppressed. In some embodiments, in a case where the initial states of the output signals QB and Q of the latch circuit 10 are reversed to each other, the operation corresponding to the NAND circuit 11 and the operation corresponding to the NAND circuit 12 may be replaced with each other in the same manner as the case where the operation corresponding to the capacitive element C1 and the operation corresponding to the capacitive element C2 are replaced with each other, and thus, the description is omitted.

As described above, the comparator circuit 1 according to some embodiments adds the capacitive elements C1 and C2 to suppress the influence of the initial state of the latch circuit 10 and the parasitic capacitances of the NAND circuits 11 and 12. In other words, the comparator circuit 1 according to some embodiments may cancel the noise generated by the parasitic capacitances of the NAND circuits 11 and 12 by opposite noise generated by the capacitive elements C1 and C2.

Figure 7:
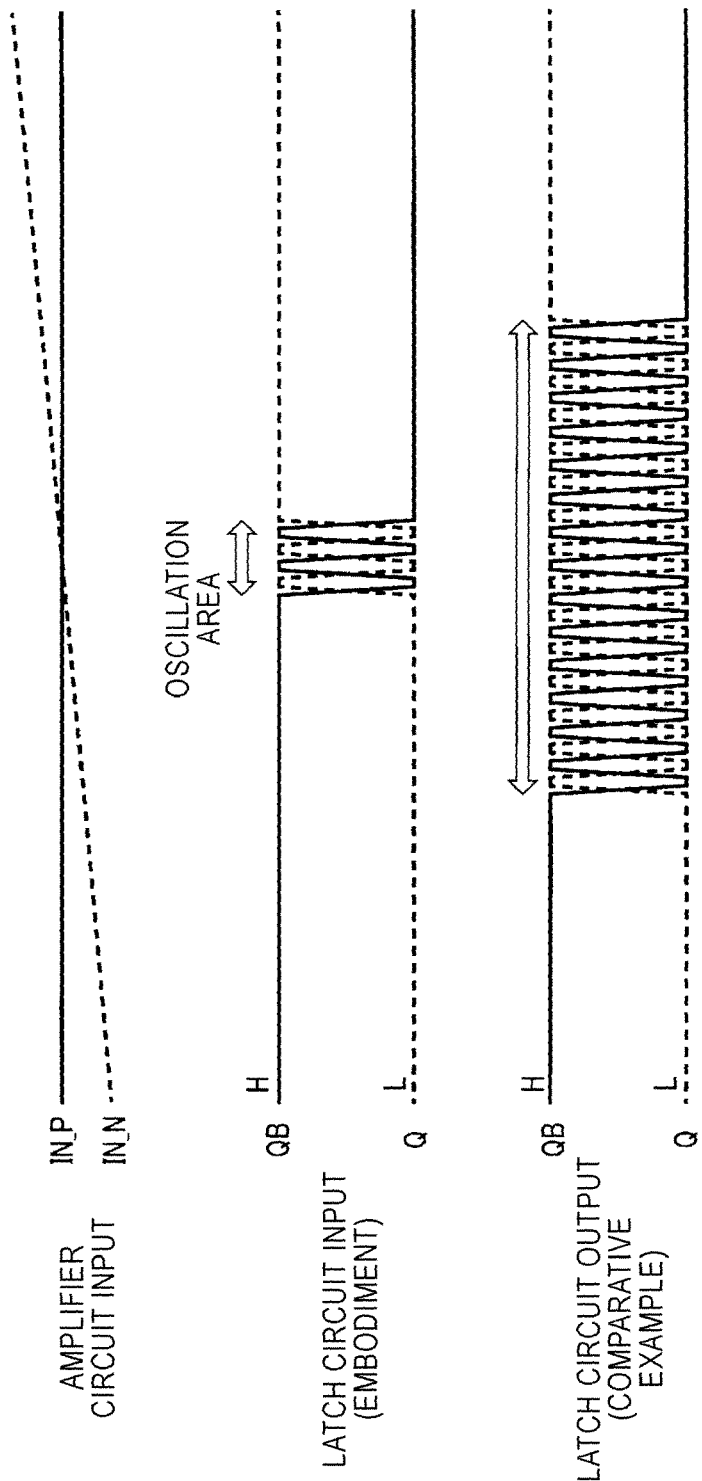
FIG. 7 is a waveform diagram of comparing the operation of the comparator circuit according to some embodiments and the operation of the comparator according to a comparative example.

As a result, in the comparator circuit 1 according to some embodiments, even when the potential difference of the output signals IN_N and IN_P is small as illustrated in FIG. 7, the oscillation area may be narrowed as compared with the comparator circuit according to the comparative example (see FIG. 7). Therefore, the comparator circuit 1 according to some embodiments can improve the determination precision when the potential difference of the output signals IN_N and IN_P is small, and can extend the operation area.

Subsequently, a latch circuit 10 including capacitive elements C1 and C2 according to some embodiments will be described.

Figure 8:
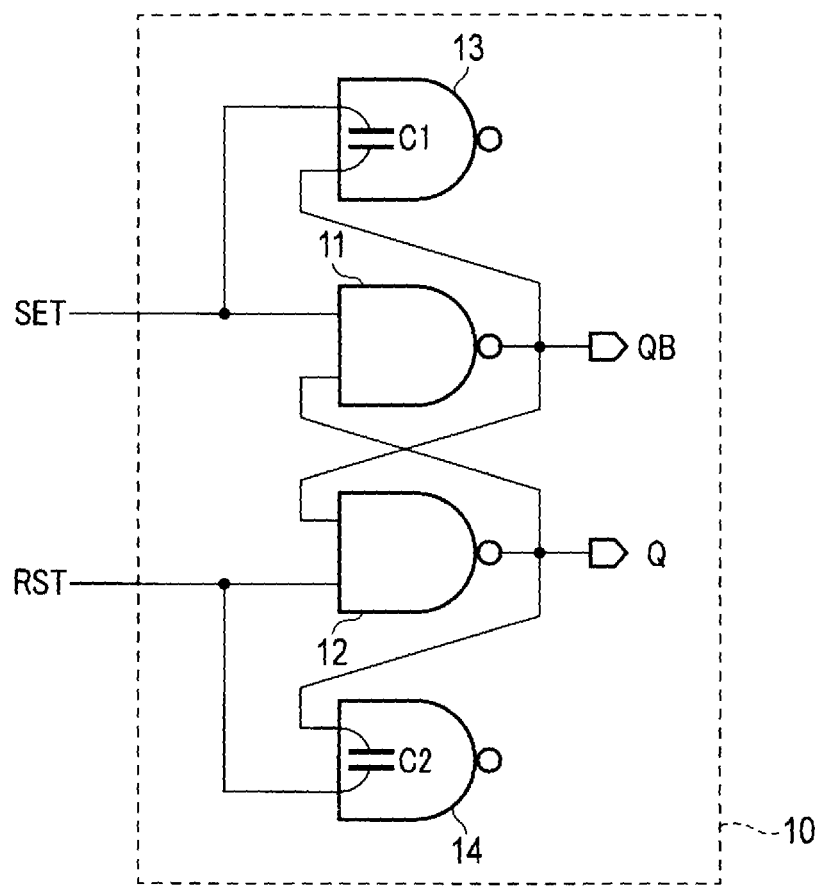
FIG. 8 is a circuit diagram of a latch circuit according to some embodiments.

Hereinafter, the latch circuit 10 according to some embodiments will be described with reference to FIG. 8. FIG. 8 illustrates the circuit configuration of the latch circuit 10 according to some embodiments. As illustrated in FIG. 8, the latch circuit 10 according to some embodiments includes the NAND circuits 13 and 14, in substitution for the capacitive elements C1 and C2 illustrated in FIG. 1, respectively.

In some embodiments, as illustrated in FIG. 8, the first input node of the NAND circuit 13 is connected to the first input node of the NAND circuit 11 and the second input node of the NAND circuit 13 is connected to the output node of the NAND circuit 11. In some embodiments, the first input node of the NAND circuit 14 is connected to the first input node of the NAND circuit 12, and the second input node of the NAND circuit 14 is connected to the output node of the NAND circuit 12.

In some embodiments, the parasitic capacitance between the first and second input nodes of the NAND circuit 13 may be substantially the same as the capacitive element C1 as shown in FIG. 1. In some embodiments, the parasitic capacitance between the first and second input nodes of the NAND circuit 14 may be substantially the same as the capacitive element C2 as shown in FIG. 1. That is, in some embodiments, in the latch circuit 10, the NAND circuit 13 includes the capacitive element C1 and the NAND circuit 14 includes the capacitive element C2. In some embodiments, one end of the capacitive element C1 may be connected to the first input node of the NAND circuit 13, and the other end of the capacitive element C1 may be connected to the second input node of the NAND circuit 13. In some embodiments, one end of the capacitive element C2 may be connected to the first input node of the NAND circuit 14, and the other end of the capacitive element C2 is connected to the second input node of the NAND circuit 14.

Figure 9:
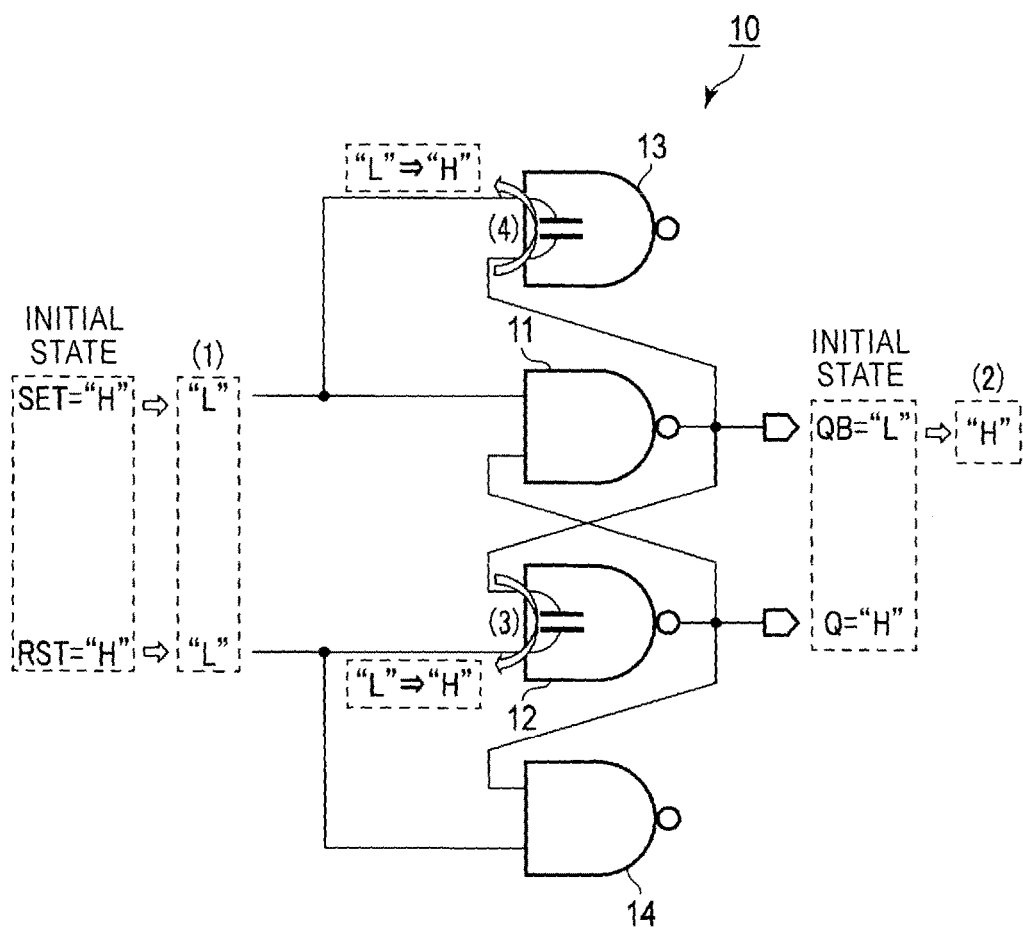
FIG. 9 is a diagram for describing an operation of the latch circuit in a comparator circuit according to some embodiments.
Figure 10:
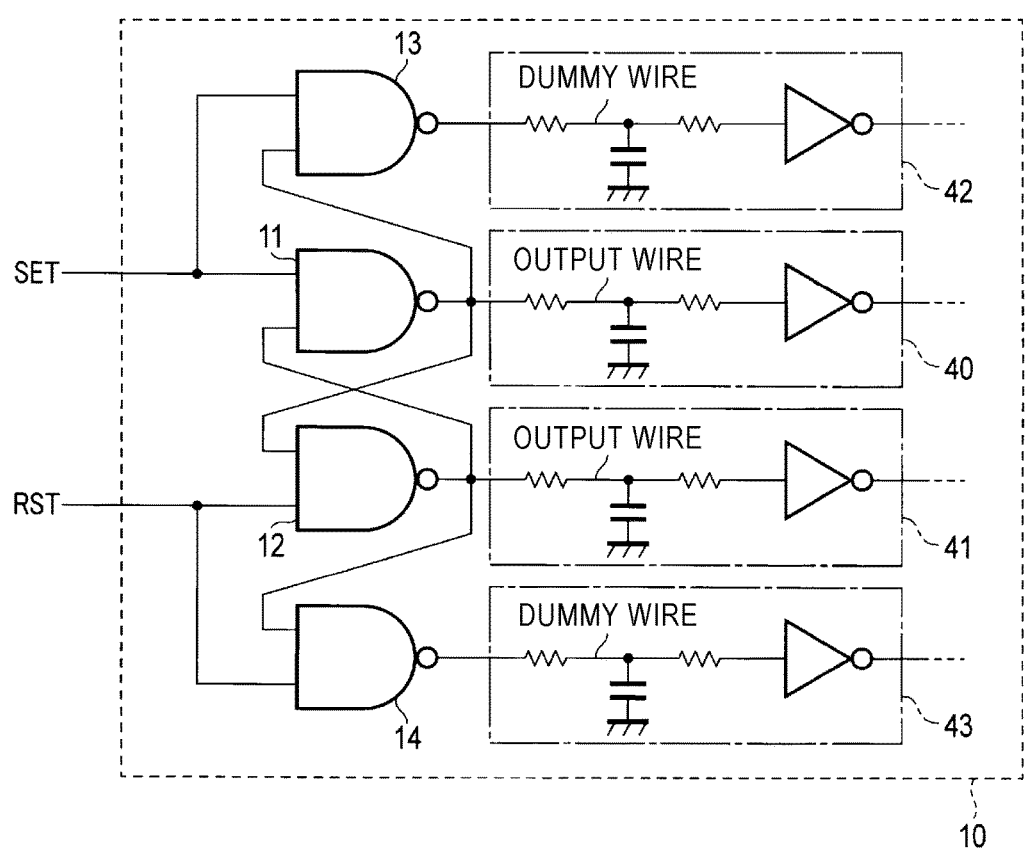
FIG. 10 is a circuit diagram of a latch circuit according to some embodiments.

Effect of the Embodiments Illustrated in FIG. 8 to FIG. 10

The operation area of the comparator circuit 1 may be extended by using the latch circuit 10 described above (e.g., the latch circuit 10 as shown in FIG. 8). Hereinafter, this effect will be described in detail with reference to FIG. 9. FIG. 9 as an example operation of the comparator circuit 1 using the latch circuit 10 according to some embodiments illustrates the operation of the latch circuit 10 when the potential difference of the input signals IN_N and IN_P is small. Further, the initial state in the operation illustrated in FIG. 9 is the same as that of FIG. 6.

In some embodiments, the operation from the initial state of FIG. 9 to the state as shown in (2) of FIG. 9 is the same as the operation from the initial state of FIG. 6 to the state as shown in (2) of FIG. 6. That is, in some embodiments, when the clock signal CLK changes to level "H" from level "L," the voltages of both the set signal SET and the reset signal RST drop up to the voltage of level "L" ((1) of FIG. 9), and the output signal QB of the NAND circuit 11 changes to level "H" from level "L" ((2) of FIG. 9). As a result, in some embodiments, the change in output voltage of the NAND circuit 11 may be transferred through the parasitic capacitance between the first and second input nodes of the NAND circuit 12. As a result, in some embodiments, the voltage of the first input node of the NAND circuit 12 may rise ((3) of FIG. 9). As a result, in some embodiments, the output voltage of the NAND circuit 12 may drop, and the voltage change may be transferred to the first input node of the NAND circuit 12 through the parasitic capacitance between the first and second input nodes of the NAND circuit 14 ((4) of FIG. 9). That is, in some embodiments, the voltage of the first input node of the NAND circuit 12 may tend to change to level "H" from level "L" in (3) of FIG. 9 and may tend to change to level "L" from level "H" in (4) of FIG. 9.

In some embodiments, since the operation corresponding to (3) of FIG. 9 and the operation corresponding to (4) of FIG. 9 become the canceling operations, the change in voltage in the first input node and the output node of the NAND circuit 12 may be suppressed. In some embodiments, since the voltage change in the first input node of the NAND circuit 12 is suppressed, the voltage change in the second input node of the NAND circuit 12 may be also suppressed, and as a result, in some embodiments, the change of the output signal QB described in (2) of FIG. 9 may be also suppressed. In some embodiments, in a case where the initial states of the output signals QB and Q of the latch circuit 10 are reversed to each other, the operation corresponding to the NAND circuit 11 and the operation corresponding to the NAND circuit 12 may be replaced with each other in the same manner as the case where the operation corresponding to the NAND circuit 13 and the operation corresponding to the NAND circuit 14 are replaced with each other, and thus, the description is omitted.

As described above, the latch circuit 10 according to some embodiments adopts the NAND circuits 13 and 14 (see FIG. 9) to suppress the influence of the initial state of the latch circuit 10 and the parasitic capacitances of the NAND circuits 11 and 12. In other words, the comparator circuit 1 according to some embodiments may cancel noise generated by the parasitic capacitances of the NAND circuits 11 and 12 by opposite noise generated by the parasitic capacitances of the NAND circuits 13 and 14.

As a result, the comparator circuit 1 using the latch circuit 10 according to some embodiments may improve the determination precision when the potential difference of the output signals IN_N and IN_P is small and extend the operation area similarly to the embodiments illustrated in FIG. 1, FIG. 2, or FIG. 6.

Further, in some embodiments, the NAND circuits 13 and 14 may be installed in the same structures as, for example, the NAND circuits 11 and 12, respectively. In some embodiments, the parasitic capacitance between the first and second input nodes of the NAND circuit 13 may be substantially the same as the parasitic capacitance between the first and second input nodes of the NAND circuit 11 and the parasitic capacitance between the first and second input nodes of the NAND circuit 14 may be substantially the same as the parasitic capacitance between the first and second input nodes of the NAND circuit 12. Therefore, in some embodiments, in the latch circuit 10, the noise by the parasitic capacitances of the NAND circuits 11 and 12 and the opposite noise by the parasitic capacitances of the NAND circuits 13 and 14 may be substantially the same as each other, and as a result, the influence of the parasitic capacitance may be cancelled with high accuracy.

Further, in some embodiments, no element is connected to the output nodes of the NAND circuits 13 and 14. However, other embodiments are not limited thereto. In some embodiments, as illustrated in FIG. 10, the outputs of the NAND circuits 11 and 12 may be configured in the same structure as the outputs of the NAND circuits 13 and 14. FIG. 10 illustrates a circuit configuration of a latch circuit 10 according to some embodiments and illustrates a more detailed circuit configuration of an output unit in the NAND circuit. Further, in FIG. 10, wiring resistances and capacitances of various wires are displayed.

In some embodiments, as illustrated in FIG. 10, the output nodes of the NAND circuits 11 to 14 correspond to output units 40 to 43, respectively. In some embodiments, in the output unit 40, an output wire of the NAND circuit 11 is connected to, for example, an inverter. In some embodiments, the output unit 41 has the same structure as, for example, the output unit 40. In some embodiments, in the output unit 42, a dummy wire of the NAND circuit 13 is connected to, for example, an inverter. In some embodiments, the output unit 43 has the same structure as, for example, the output unit 42. In some embodiments, the output units 40 and 42 have the same structure and the output units 41 and 43 have the same structure. As a result, in some embodiments, the wiring resistances and capacitances in the output units of the NAND circuits 13 and 14 may be substantially the same as the wiring resistances and capacitances in the output units of the NAND circuits 11 and 12. Therefore, the latch circuit 10 according to some embodiments may make characteristics of the NAND circuits 13 and 14 be closer to the NAND circuits 11 and 12 and increase an effect of suppressing influences of the parasitic capacitances of the NAND circuits 11 and 12.

Subsequently, a comparator circuit 1 and a latch circuit 10 according to some embodiments will be described. In the comparator circuit 1 according some embodiments, a NOR circuit may be used as the latch circuit 10 in the comparator circuit 1.

Figure 11:
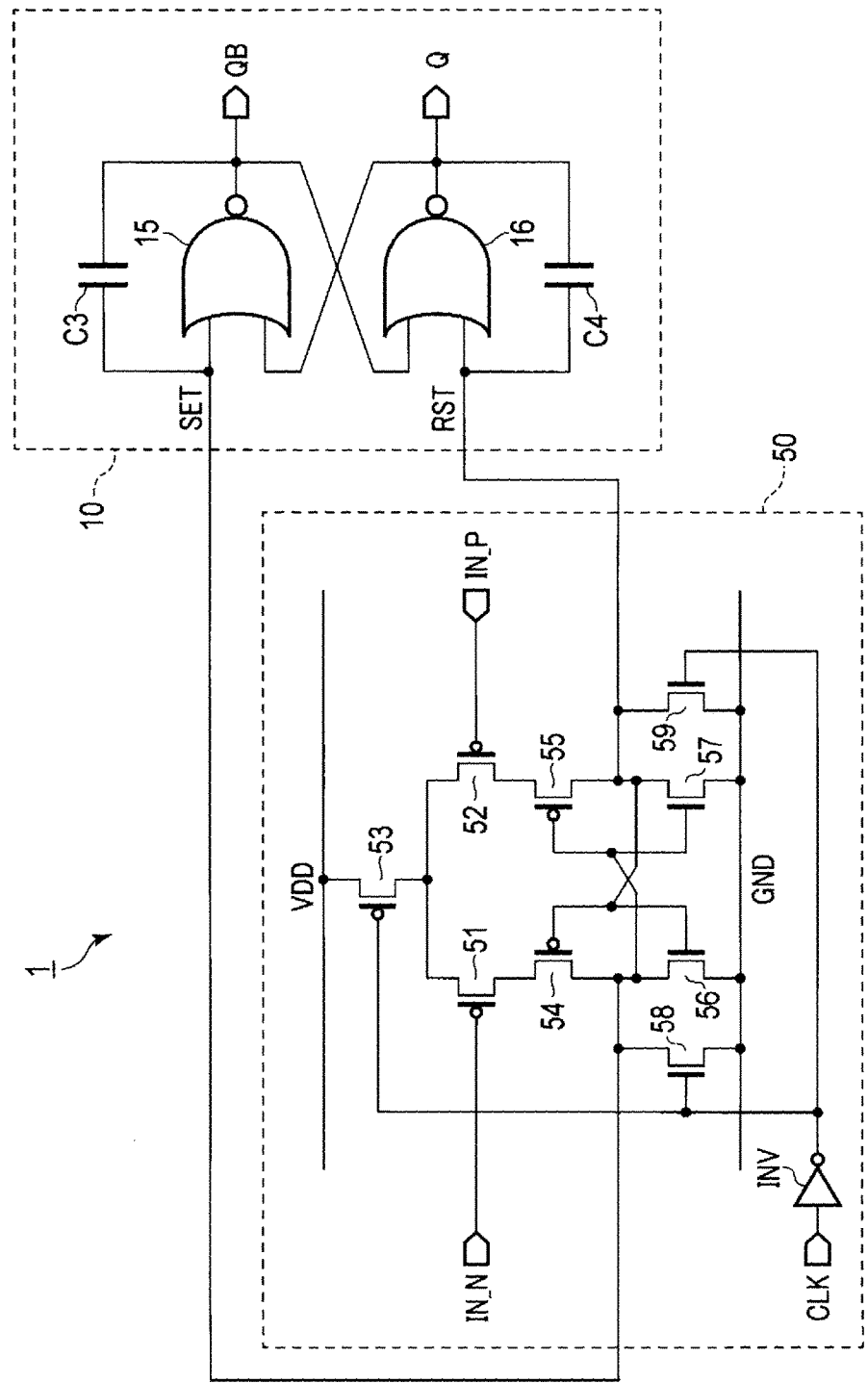
FIG. 11 is a circuit diagram of a comparator circuit according to some embodiments.

Hereinafter, the configuration of the comparator circuit 1 according to some embodiments will be described with reference to FIG. 11. FIG. 11 illustrates the circuit configuration of the comparator circuit 1 according to some embodiments including a latch circuit 10 and an amplifier circuit 50. As illustrated in FIG. 11, the comparator circuit according to some embodiments is different from the comparator circuit 1 described with reference to FIG. 1 in some embodiments in the circuit configurations of the latch circuit 10 and the amplifier circuit 20.

In some embodiments, as illustrated in FIG. 11, the latch circuit 10 includes NOR circuits 15 and 16 and capacitive elements C3 and C4. In some embodiments, a connection relationship between the NOR circuits 15 and 16 and the capacitive elements C3 and C4 is the same as the connection relationship of the NAND circuits 11 and 12 and the capacitive elements C1 and C2 in the circuit configuration of the latch circuit 10 as shown in FIG. 1. Therefore, the description is omitted.

In some embodiments, as illustrated in FIG. 11, the amplifier circuit 50 is, for example, a differential amplifier circuit that amplifies a difference of input signals IN_N and IN_P. In some embodiments, as illustrated in FIG. 11, the amplifier circuit 50 includes P channel MOS transistors 51 to 55 and N channel MOS transistors 56 to 59.

In some embodiments, the input signal IN_N is input into the gate of the transistor 51, and the input signal IN_P is input into the gate of the transistor 52. In some embodiments, one end of each of the transistors 51 and 52 is connected to one end of the transistor 53, and the other end of the transistor 53 is connected to a power supply line VDD. In some embodiments, the other ends of the transistors 51 and 52 are connected to one end of the transistor 54 and one end of the transistor 55, respectively. In some embodiments, the gates of the transistors 54 and 55 are connected to the other ends of the transistors 55 and 54, respectively.

In some embodiments, one end of the transistor 56 and one end of the transistor 57 are connected to the other ends of the transistors 54 and 55, respectively, and the other ends of the transistors 56 and 57 are connected to a ground line GND. In some embodiments, the gates of the transistors 56 and 57 are connected to the gates of the transistors 54 and 55, respectively. In some embodiments, one end of the transistor 58 and one end of the transistor 59 are connected to the other ends of the transistors 54 and 55, respectively, and the other ends of the transistors 58 and 59 are connected to the power ground line GND.

In some embodiments, in the amplifier circuit 50 described above, a clock signal CLK is input into the gates of the transistors 53, 58, and 59 via an inverter INV. In some embodiments, one end of the transistor 58 and one end of the transistor 59 are used as outputs of the differential amplifier circuit (or the amplifier circuit 50). That is, in the comparator circuit 1 according to some embodiments, one end of the transistor 58 is connected to the first input node of the NAND circuit 15, and one end of the transistor 59 is connected to the first input node of the NAND circuit 16.

Other embodiments are not limited to the circuit configuration of the comparator circuit 1 described above (as shown in FIG. 11).

Figure 12:
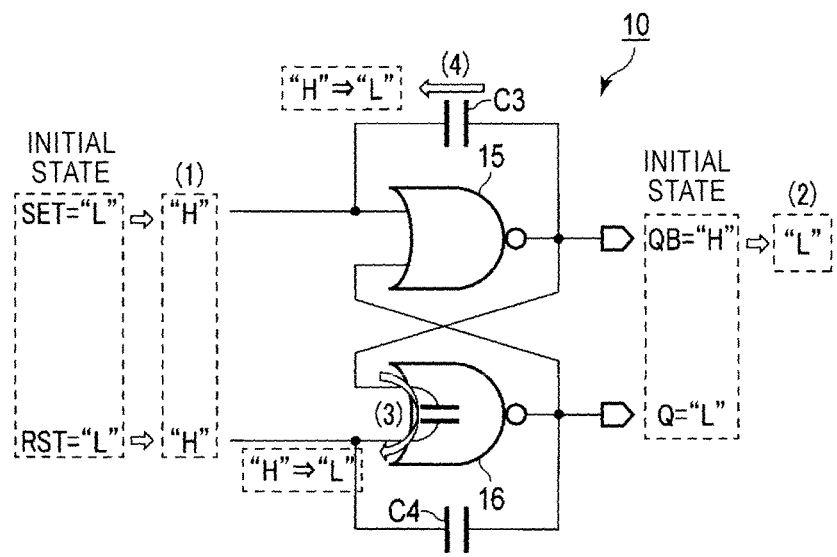
FIG. 12 is a diagram for describing an operation of a latch circuit in the comparator circuit according to some embodiments.

Effect of the Embodiments Illustrated in FIG. 11 or FIG. 12

According to the comparator circuit 1 regarding some embodiments described above, the operation area of the comparator circuit 1 may be extended. Hereinafter, this effect will be described in detail with reference to FIG. 12. FIG. 12 is an example operation of the comparator circuit 1 according to some embodiments and illustrates the operation of the latch circuit 10 when the potential difference of the input signals IN_N and IN_P is small. In some embodiments, in the initial state in the operation illustrated in FIG. 12, the set signal SET and the reset signal RST are at level "L" and the output signals QB and Q are at levels "H" and "L," respectively.

In some embodiments, when the clock signal CLK changes to level "H" from level "L," the potential difference of the output signals IN_N and IN_P may be small, and as a result, the voltage of the set signal SET and the voltage of the reset signal RST may rise at the same speed. Then, in some embodiments, before the potential difference of the set signal SET and the reset signal RST increases, both the voltage of the set signal SET and the voltage of the reset signal RST may rise up to the voltage at level "H" ((1) of FIG. 12). As a result, in some embodiments, in the NOR circuit 15, since the signals at levels "H" and "L" are input into the first and second input nodes, respectively, the output signal QB may change to level "L" from level "H" ((2) of FIG. 12). In this case, in some embodiments, the change in output voltage of the NOR circuit 15 may be transferred through the parasitic capacitance between the first and second input nodes of the NOR circuit 16 and the voltage of the first input node of the NOR circuit 16 may drop ((3) of FIG. 12). In some embodiments, as a result, the output voltage of the NOR circuit 16 may rise and the voltage change may be transferred to the first input node of the NOR circuit 16 through the capacitive element C4 ((4) of FIG. 12). That is, in some embodiments, the voltage of the first input node of the NOR circuit 16 may tend to change to level "L" from level "H" in (3) of FIG. 12 and may tend to change to level "H" from level "L" in (4) of FIG. 9.

As such, in some embodiments, since the operation corresponding to (3) of FIG. 12 and the operation corresponding to (4) of FIG. 12 become the canceling operations, the change in voltage in the first input node and the output node of the NOR circuit 16 may be suppressed. In some embodiments, since the voltage change in the first input node of the NOR circuit 16 is suppressed, the voltage change in the second input node of the NOR circuit 16 may be also suppressed, and as a result, the change of the output signal QB described in (2) of FIG. 12 may be also suppressed. In some embodiments, in a case where the initial states of the output signals QB and Q of the latch circuit 10 are reversed to each other, the operation corresponding to the NOR circuit 15 and the operation corresponding to the NOR circuit 16 may be replaced with each other in the same manner as the operation corresponding to the capacitive element C3 and the operation corresponding to the capacitive element C4 are replaced with each other. Thus, the description is omitted.

As described above, the comparator circuit 1 according to some embodiments may add the capacitive elements C3 and C4 to suppress the influence of the initial state of the latch circuit 10 and the parasitic capacitances of the NOR circuits 15 and 16. In other words, the comparator circuit 1 according to some embodiments may cancel the noise generated by the parasitic capacitances of the NOR circuits 15 and 16 by the opposite noise generated by the capacitive elements C3 and C4.

As a result, in the comparator circuit 1 according to some embodiments, even when the potential difference of the output signals IN_N and IN_P is small, the oscillation area may be narrowed similarly to the embodiments illustrated in FIG. 1, FIG. 2, or FIG. 6. Therefore, the comparator circuit 1 according to some embodiments may improve the determination precision when the potential difference of the output signals IN_N and IN_P is small and extend the operation area.

Subsequently, a latch circuit 10 including capacitive elements C3 and C4 according to some embodiments will be described.

Figure 13:
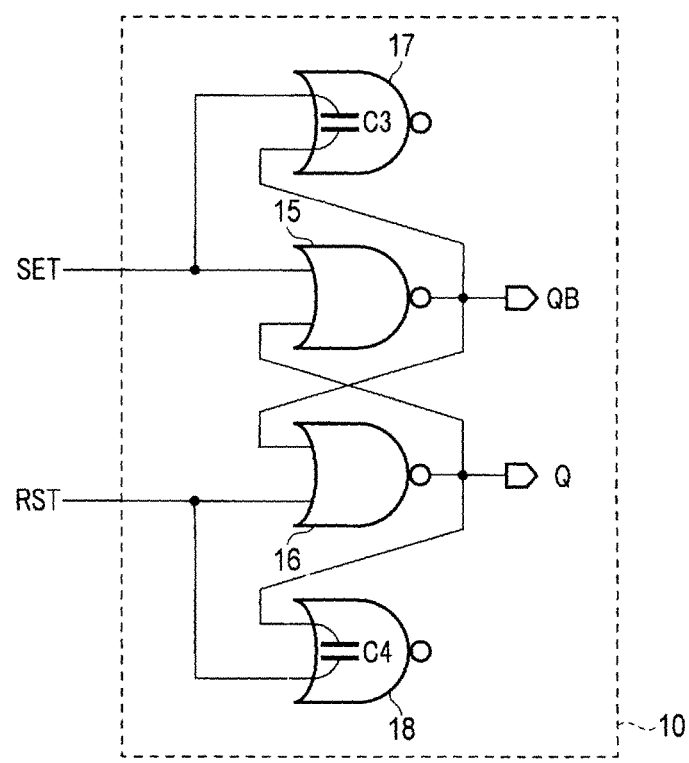
FIG. 13 is a circuit diagram of a latch circuit according to some embodiments.

Hereinafter, the latch circuit 10 according to some embodiments will be described with reference to FIG. 13. FIG. 13 illustrates the circuit configuration of the latch circuit 10 according to some embodiments. As illustrated in FIG. 13, the latch circuit 10 according to some embodiments includes NOR circuits 17 and 18 in substitution for the capacitive elements C3 and C4 as shown in FIG. 11, respectively.

In some embodiments, as illustrated in FIG. 13, the first input node of the NOR circuit 17 is connected to the first input node of a NOR circuit 15, and the second input node of the NOR circuit 17 is connected to the output node of the NOR circuit 15. In some embodiments, the first input node of the NOR circuit 18 is connected to the first input node of the NOR circuit 16, and the second input node of the NOR circuit 18 is connected to the output node of the NOR circuit 16.

In some embodiments, the parasitic capacitance between the first and second input nodes of the NOR circuit 17 may be substantially the same as the capacitive element C3 as shown in FIG. 11 or FIG. 12. In some embodiments, the parasitic capacitance between the first and second input nodes of the NOR circuit 18 may be substantially the same as the capacitive element C4 as shown in FIG. 11 or FIG. 12. That is, in the latch circuit 10 according to some embodiments, the NOR circuit 17 may include the capacitive element C3 and the NOR circuit 18 may include the capacitive element C4. In this case, in some embodiments, one end of the capacitive element C3 may be connected to the first input node of the NOR circuit 17 and the other end of the capacitive element C3 may be connected to the second input node of the NOR circuit 17. In some embodiments, one end of the capacitive element C4 may be connected to the first input node of the NOR circuit 18 and the other end of the capacitive element C4 may be connected to the second input node of the NOR circuit 18.

Effect of the Embodiment Illustrated in FIG. 13

Figure 14:
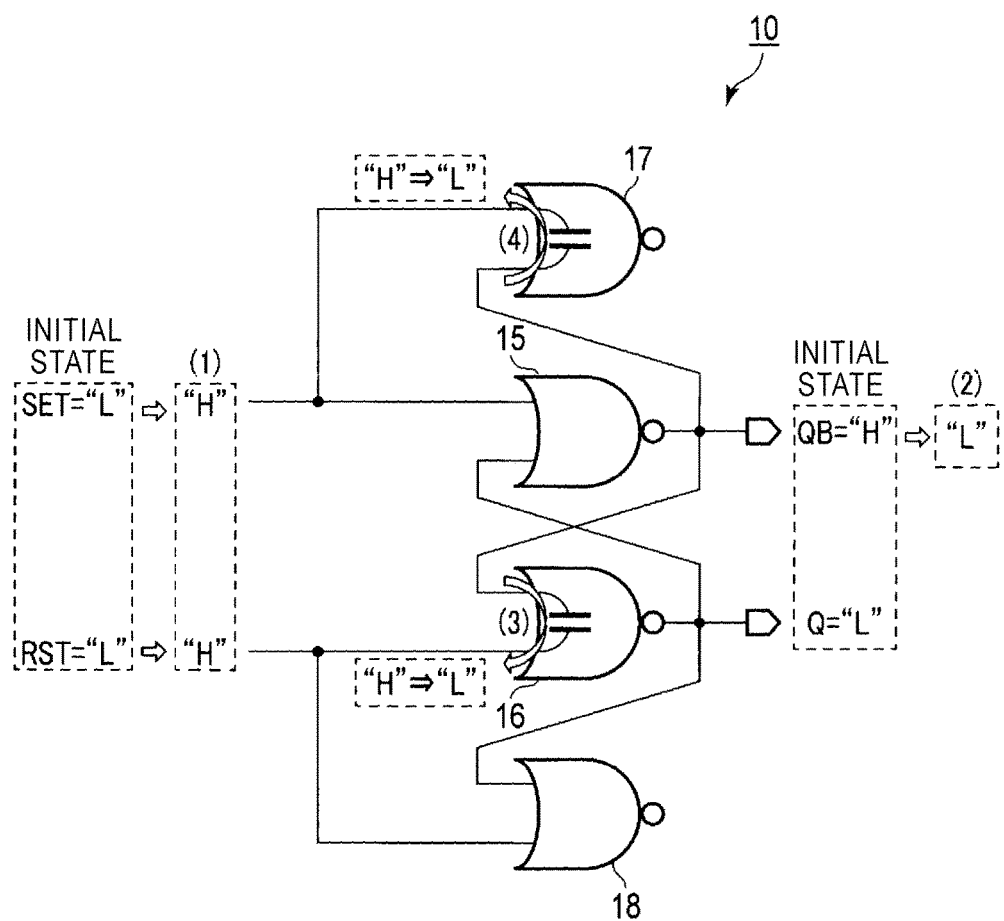
FIG. 14 is a diagram for describing an operation of the latch circuit in a comparator circuit according to some embodiments.

As in the embodiments illustrated in FIG. 11 or FIG. 12, the operation area of the comparator circuit 1 may be extended by using the latch circuit 10 described above. Hereinafter, this effect will be described in detail with reference to FIG. 14. FIG. 14 is an example operation of the comparator circuit 1 using the latch circuit 10 according to some embodiments (see FIG. 13) and illustrates the operation of the latch circuit 10 when the potential difference of the input signals IN_N and IN_P is small. Further, it is assumed that the initial state in the operation illustrated in FIG. 14 is the same as that of FIG. 12.

In some embodiments, the operation from the initial state of FIG. 14 to the state as shown in (2) of FIG. 14 is the same as the operation from the initial state of FIG. 12 to the state as shown in (2) of FIG. 12. That is, in some embodiments, when the clock signal CLK changes to level "H" from level "L," both the voltages of the set signal SET and the reset signal RST may rise up to the voltage of level "H" ((1) of FIG. 14) and the output signal QB of the NOR circuit 15 may change to level "L" from level "H" ((2) of FIG. 14). As a result, in some embodiments, the change in output voltage of the NOR circuit 15 may be transferred through the parasitic capacitance between the first and second input nodes of the NOR circuit 16 and the voltage of the first input node of the NOR circuit 16 thus drops ((3) of FIG. 14). As a result, in some embodiments, the output voltage of the NOR circuit 16 may rise and the voltage change may be transferred to the first input node of the NOR circuit 16 through the parasitic capacitance between the first and second input nodes of the NOR circuit 18 ((4) of FIG. 14). That is, in some embodiments, the voltage of the first input node of the NOR circuit 16 may tend to change to level "L" from level "H" in (3) of FIG. 14 and may tend to change to level "H" from level "L" in (4) of FIG. 14.

As such, in some embodiments, since the operation corresponding to (3) of FIG. 14 and the operation corresponding to (4) of FIG. 14 become the canceling operations, the change in voltage in the first input node and the output node of the NOR circuit 16 may be suppressed. In some embodiments, since the voltage change in the first input node of the NOR circuit 16 is suppressed, the voltage change in the second input node of the NOR circuit 16 may be also suppressed, and as a result, in some embodiments, the change of the output signal QB described in (2) of FIG. 14 may be also suppressed. In some embodiments, in a case where the initial states of the output signals QB and Q of the latch circuit 10 are reversed to each other, the operation corresponding to the NOR circuit 15 and the operation corresponding to the NOR circuit 16 may be replaced with each other in the same manner as the operation corresponding to the NOR circuit 17 and the operation corresponding to the NOR circuit 18 are replaced with each other. Thus, the description is omitted.

As described above, the latch circuit 10 according to some embodiments may adopt the NOR circuits 17 and 18 to suppress the influence of the initial state of the latch circuit 10 and the parasitic capacitances of the NOR circuits 15 and 16. In other words, the comparator circuit 1 according to some embodiments may cancel the noise generated by the parasitic capacitances of the NOR circuits 15 and 16 by the opposite noise generated by the parasitic capacitances of the NOR circuits 17 and 18.

As a result, the comparator circuit 1 using the latch circuit 10 according to some embodiments may improve the determination precision when the potential difference of the output signals IN_N and IN_P is small and extend the operation area similarly to the embodiments illustrated in FIG. 1, FIG. 2, or FIG. 6.

Further, in some embodiments, the NOR circuits 17 and 18 may be installed in the same structures as, for example, the NOR circuits 15 and 16, respectively. In this case, in some embodiments, the parasitic capacitance between the first and second input nodes of the NOR circuit 17 may be substantially the same as the parasitic capacitance between the first and second input nodes of the NOR circuit 15, and the parasitic capacitance between the first and second input nodes of the NOR circuit 18 may be substantially the same as the parasitic capacitance between the first and second input nodes of the NOR circuit 18. As a result, in some embodiments, in the latch circuit 10, the noise by the parasitic capacitances of the NOR circuits 15 and 16 and the noise by the parasitic capacitances of the NOR circuits 17 and 18 may be substantially the same as each other, and as a result, the influence of the parasitic capacitance may be efficiently cancelled.

Figure 15:
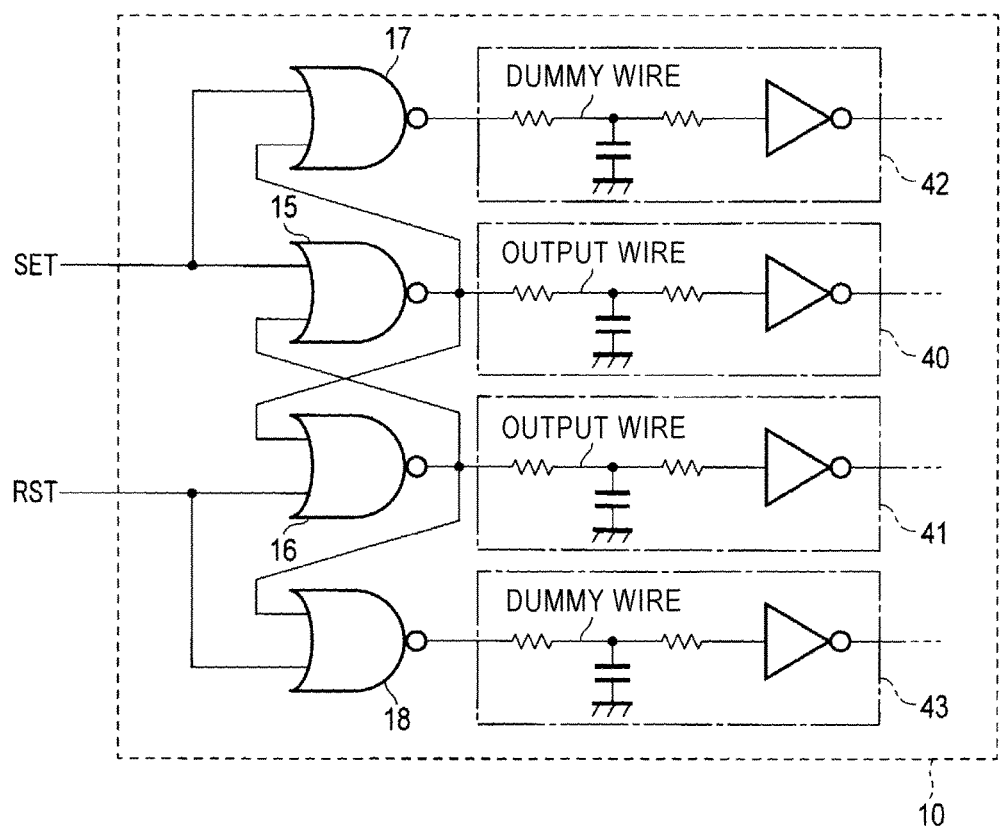
FIG. 15 is a circuit diagram of a latch circuit according to some embodiments.

Further, in some embodiments, no element is connected to the output nodes of the NOR circuits 17 and 18. However, other embodiments are not limited thereto. For example, as illustrated in FIG. 15, the outputs of the NOR circuits 15 and 16 may be configured in the same structure as the outputs of the NOR circuits 17 and 18. FIG. 15 illustrates a circuit configuration of a latch circuit 10 according to some embodiments and illustrates a more detailed circuit configuration of an output unit in the NOR circuit. Further, in FIG. 15, the wiring resistances and capacitances of various wires are illustrated.

In some embodiments, as illustrated in FIG. 15, the output nodes of the NOR circuits 15 to 18 correspond to the output units 40 to 43, respectively. In some embodiments, the output units 40 to 43 may be the same as the output units 40 to 43 as shown in FIG. 10. As a result, in some embodiments, the wiring resistances and capacitances in the output units of the NOR circuits 17 and 18 may be the same as the wiring resistances and capacitances in the output units of the NOR circuits 15 and 16. Therefore, the latch circuit 10 according to some embodiments may make characteristics of the NOR circuits 17 and 18 be closer to the NOR circuits 15 and 16 and increase an effect of suppressing influences of the parasitic capacitances of the NOR circuits 15 and 16.

The latch circuit 10 of some embodiments may include the first and second NAND circuits (e.g., see FIG. 1, FIG. 11, or FIG. 12) and the first and second capacitive elements (e.g., see FIG. 1; C1, and C2). In some embodiments, in the first NAND circuit, the first signal (e.g., SET in FIG. 1) may be input into the first input node. In some embodiments, in the second NAND circuit, the second signal (e.g., RST in FIG. 1) may be input into the first input node, the second input node may be connected to the output node of the first NAND circuit, and the output node may be connected to the second input node of the first NAND circuit. In some embodiments, in the first capacitive element, one end may be connected to the first input node of the first NAND circuit and the other end may be connected to the output node of the first NAND circuit. In some embodiments, in the second capacitive element, one end may be connected to the first input node of the second NAND circuit and the other end may be connected to the output node of the second NAND circuit.

As a result, in some embodiments, the latch circuit and the comparator circuit capable of extending the operation area may be provided.

In some embodiments, the comparator circuit 1 may be configured by combining the latch circuit 10 and the amplifier circuit 20. However, other embodiments are not limited thereto. In some embodiments, when the comparator circuit 1 is configured, two input signals input into the latch circuit 10 may be input from different circuits, respectively, instead of installing the amplifier circuit 20.

Further, in some embodiments, the comparator circuit 1 may be configured by combining the latch circuit 10 and the amplifier circuit 20. However, the use of the latch circuit 10 is not limited thereto. In some embodiments, the latch circuit 10 may be used even with respect to another semiconductor circuit.

Further, in some embodiments, the latch circuit 10 may be configured with the NAND circuit or the NOR circuit. However, other embodiments are not limited thereto. In some embodiments, the NAND circuit in the latch circuit 10 described in the embodiments illustrated in FIG. 1, FIG. 2, FIG. 6 and FIG. 8 to FIG. 10 may be configured by combining an AND circuit and a NOT circuit. In some embodiments, the NOR circuit in the latch circuit 10 described in the embodiments illustrated in FIG. 11 to FIG. 15 may be configured by combining an OR circuit and the NOT circuit. As such, in some embodiments, when logical states of input and output signals are not changed, the combination of all logic circuits may be applied.

Further, other embodiments are not limited to the circuit configurations of the output units 42 and 43 described in the embodiments illustrated in FIG. 8 to FIG. 15. In some embodiments, the output units 42 and 43 may have circuit configurations similar to those of the output units 40 and 41, respectively. In some embodiments, only the dummy wire corresponding to the output wire may be installed with respect to the NAND circuits 13 and 14 or the NOR circuits 17 and 18. Even in this case, the characteristics of the NAND circuits 13 and 14 may be made to be close to the NAND circuits 11 and 12 and similarly, the characteristics of the NOR circuits 17 and 18 may be made to be close to the NOR circuits 15 and 16, and as a result, the influence of the parasitic capacitance in the latch circuit 10 may be suppressed.

Further, in the present disclosure, "connection" represents that elements are electrically connected, and for example, another element may interposed therebetween.

As used herein, the terms "about," "approximately," and "substantially" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be substantially the same as a second numerical value if the first numerical value lies within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A latch circuit comprising:
a first NAND circuit including an output node, a first input node and a second input node wherein a first signal is input into the first input node of the first NAND circuit;
a second NAND circuit including an output node, a first input node and a second input node wherein a second signal is input into the first input node of the second NAND circuit, the second input node of the second NAND circuit is connected to the output node of the first NAND circuit, and the output node of the second NAND circuit is connected to the second input node of the first NAND circuit;
a first capacitive element including one end connected to the first input node of the first NAND circuit and including another end connected to the output node of the first NAND circuit; and
a second capacitive element including one end connected to the first input node of the second NAND circuit and including another end connected to the output node of the second NAND circuit.

2. A latch circuit comprising:
a first NAND circuit including an output node, a first input node and a second input node wherein a first signal is input to the first input node of the first NAND circuit;
a second NAND circuit including an output node, a first input node and a second input node wherein a second signal is input to the first input node of the second NAND circuit, the second input node of the second NAND circuit is connected to the output node of the first NAND circuit, and the output node of the second NAND circuit is connected to the second input node of the first NAND circuit;
a third NAND circuit including a first input node and a second input node; and
a fourth NAND circuit including a first input node and a second input node, wherein
the first input node of the third NAND circuit is connected to the first input node of the first NAND circuit and the second input node of the third NAND circuit is connected to the output node of the first NAND circuit, and
the first input node of the fourth NAND circuit is connected to the first input node of the second NAND circuit and the second input node of the fourth NAND circuit is connected to the output node of the second NAND circuit.

3. The latch circuit according to claim 1, wherein:
a parasitic capacitance between the first and second input nodes of the first NAND circuit is substantially the same as a capacitance of the first capacitive element, and
a parasitic capacitance between the first and second input nodes of the second NAND circuit is substantially the same as a capacitance of the second capacitive element.

4. A comparator circuit comprising:
a latch circuit according to claim 1; and
a differential amplifier circuit configured to output the first signal and the second signal.

* * * * *